United States Patent [19]

Kinoshita

[11] Patent Number: 4,842,707
[45] Date of Patent: Jun. 27, 1989

[54] DRY PROCESS APPARATUS

[75] Inventor: Haruhisa Kinoshita, Tokyo, Japan

[73] Assignee: Oki Electric Industry Co., Ltd., Tokyo, Japan

[21] Appl. No.: 62,185

[22] Filed: Jun. 15, 1987

[30] Foreign Application Priority Data

Jun. 23, 1986 [JP] Japan .................................. 61-146501
Oct. 31, 1986 [JP] Japan .................................. 61-258535
Jan. 29, 1987 [JP] Japan .................................. 62-17148

[51] Int. Cl.$^4$ ............................................. C23C 14/34
[52] U.S. Cl. .................................. 204/298; 156/345; 204/192.12
[58] Field of Search ................ 204/192.1, 192.12, 298, 204/298 ME, 298 PM, 298 MM, 298 E, 298 EE, 298 MN; 156/345

[56] References Cited

U.S. PATENT DOCUMENTS

| 4,155,825 | 5/1979 | Fournier | 204/298 X |
| 4,325,776 | 4/1982 | Menzel | 204/298 X |
| 4,404,077 | 9/1983 | Fournier | 204/298 X |
| 4,434,037 | 2/1984 | Crank | 204/298 X |
| 4,461,688 | 7/1984 | Morrison, Jr. | 204/192.12 |
| 4,466,872 | 8/1984 | Einbinder | 204/298 X |
| 4,486,287 | 12/1984 | Fournier | 204/298 x |
| 4,581,118 | 4/1986 | Class et al. | 204/298 |
| 4,610,770 | 9/1986 | Saito et al. | 204/298 X |
| 4,631,106 | 12/1986 | Nakazato et al. | 204/298 X |
| 4,668,338 | 5/1987 | Maydan et al. | 204/298 X |
| 4,673,482 | 6/1987 | Setoyama et al. | 204/298 |

FOREIGN PATENT DOCUMENTS 378971 10/1985 Austria .
0136450 7/1984 European Pat. Off. .
0154158 1/1985 European Pat. Off. .
0162642 5/1985 European Pat. Off. .
0162643 5/1985 European Pat. Off. .
0163445 5/1985 European Pat. Off. .
0163446 5/1985 European Pat. Off. .
0173164 8/1985 European Pat. Off. .
3206413 9/1983 Fed. Rep. of Germany .
230565 11/1983 Fed. Rep. of Germany .
3322680 1/1984 Fed. Rep. of Germany .
3434698 4/1986 Fed. Rep. of Germany .

OTHER PUBLICATIONS

Japanese Journal of Applied Physics, vol. 20, No. 11, Nov. 1981, pp. L817–L820.
Extended Abstracts of the 18th (1986 International) Conference on Solid State Devices and Materials, Tokyo, 1986, pp. 495–498, "Magnetron–Plasma CVD System and Its Application to Aluminum Film Deposition," Kato et al.

Primary Examiner—Nam X. Nguyen
Attorney, Agent, or Firm—Spencer & Frank

[57] ABSTRACT

In a dry process apparatus comprising a reactor, a first and a second electrodes mounted inside the reactor, the first electrode being provided to mount a material to be processed thereon, and a high-frequency power supply electrically connected to the first or the second electrode to create an alternating electric field, a permanent magnet in the form of a ring with an N-pole and an S-pole is provided to generate a magnetic field that interacts with the alternating electric field to induce a magnetron discharge in the space above the material to be processed.

27 Claims, 17 Drawing Sheets

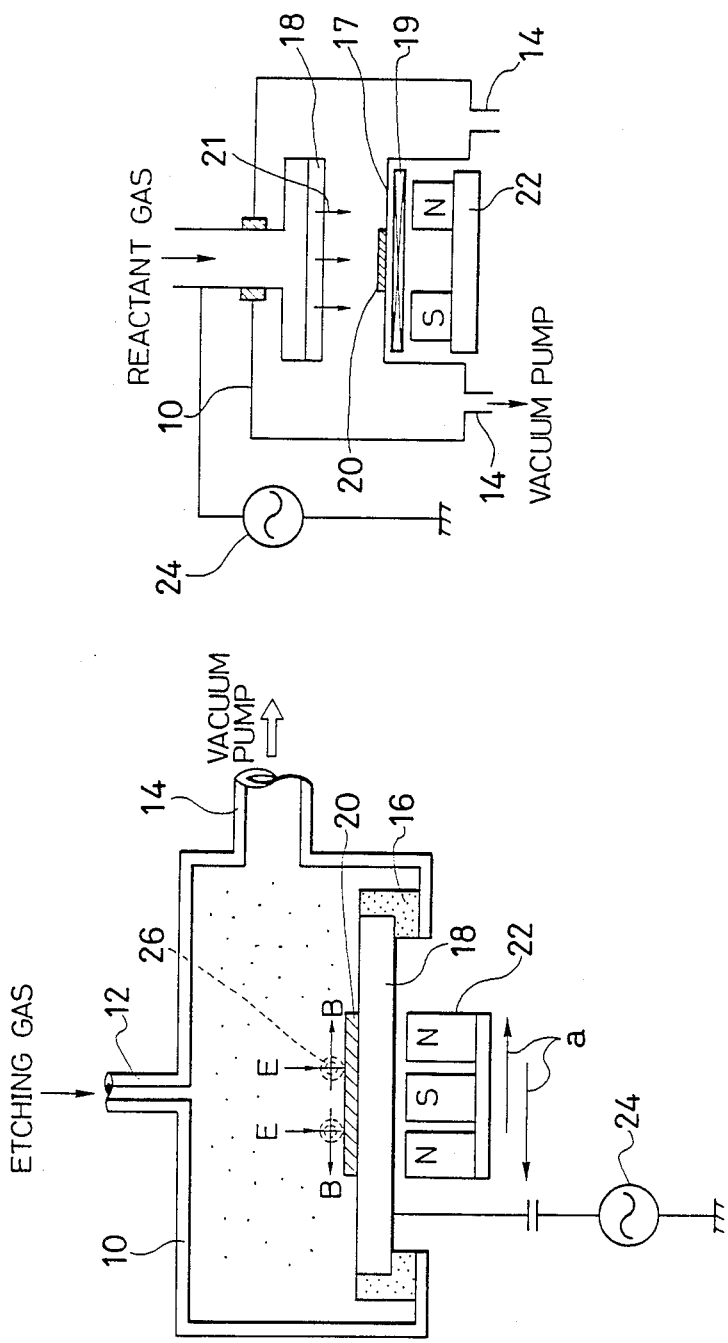

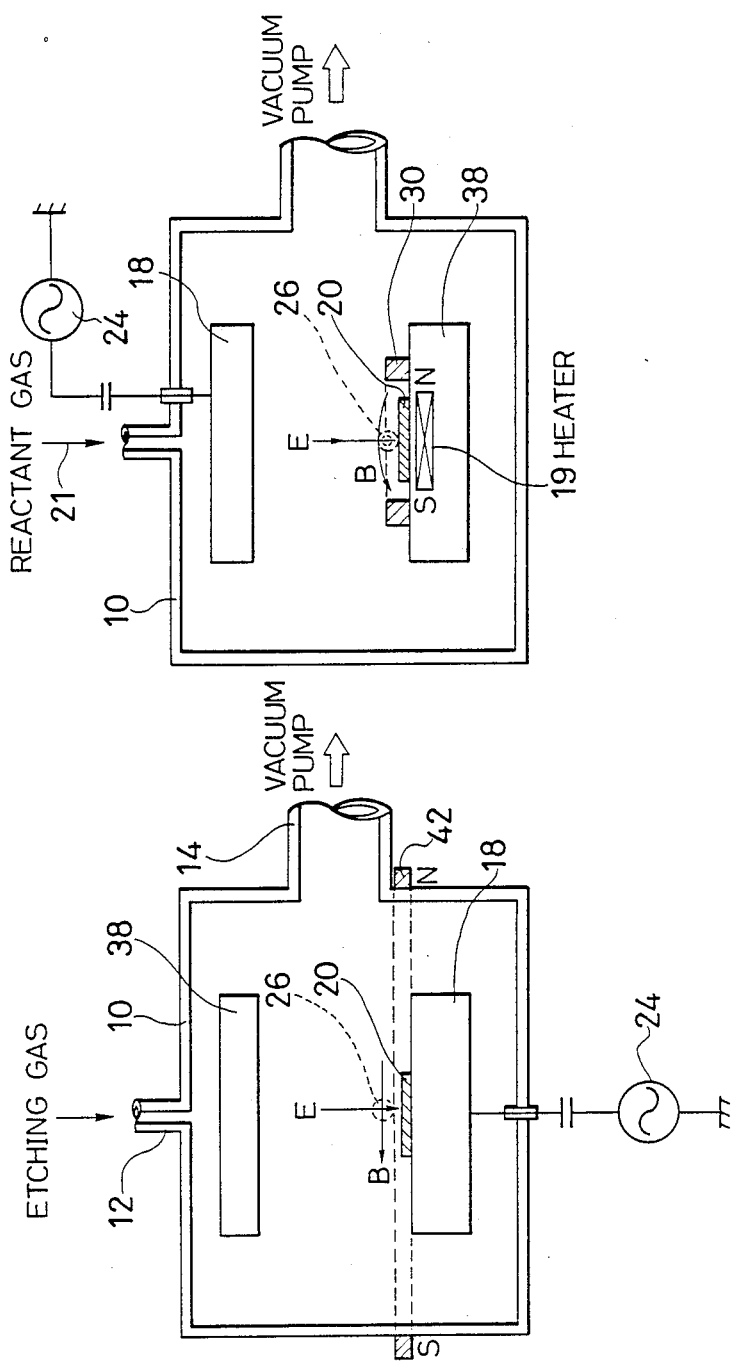

DRY PROCESS APPARATUS

BACKGROUND OF THE INVENTION

This invention relates to a magnetron-discharge-enhanced dry process apparatus.

A description of prior art dry process apparatus of this type is set forth in the Japanese Journal of Applied Physics, Vol. 20, No. 11, 1981, pp. L 817-820, and Extended Abstracts of the 18th Conference on Solid State Devices and Materials, Tokyo, 1986, pp. 495-498.

Schematic diagrams of the apparatus described in these papers are shown in FIGS. 1A and 1B. In FIG. 1A the material to be processed is situated on the cathode; in FIG. 1B it is situated on the anode.

The apparatus in FIG. 1A comprises a reactor 10 with an etching gas inlet 12 and an outlet 14 leading to a vacuum pump. In this example of the prior art, part of the floor of the reactor 10 is a cathode 18 which is fitted to a nonconductive section 16 made of a dielectric material such as Teflon. The material to be etched (which is hereinafter assumed to be a substrate) 20 is placed onto the cathode 18. Outside the reactor 10, located beneath the substrate 20 to be etched and parallel to it, is a permanent magnet assembly 22 that presents in sequence N-, S-, and N- poles toward the substrate. This permanent magnet assembly 22 is scanned (moved) in a reciprocating horizontal motion (represented by the arrows marked a in the drawing) parallel to the substrate 20. A high-frequency (rf) oscillator 24 (including a power supply and having an oscillation frequency of 13.56 MHz) supplies electromagnetic waves to the cathode 18.

After the material (substrate) 20 to be etched is placed onto the cathode 18 in the reactor 10, the reactor 10 is evacuated by the vacuum pump and etching gas is introduced at a pressure of $10^{-2}$ to $10^{-3}$ Torr; then electromagnetic waves are applied to the cathode 18 by the rf oscillator 24, thereby ionizing the etching gas to create a plasma of positive ions and negative electrons. The supplied electromagnetic waves generate an alternating electric field E oriented perpendicularly to the cathode 18. The permanent magnet assembly 22 generates a magnetic field B parallel to the cathode 18 in the positions between the N- and S-poles. Intersecting orthogonally in the space above the substrate 20, the alternating electric field E and magnetic field B cause the lightweight electrons to spiral along the lines of magnetic force in a tight cyclotron motion during which they undergo high-energy collisions with the neutral etching gas, thereby generating a high-density plasma which induces a magnetron discharge 26 in this region.

The apparatus of the prior art shown in FIG. 1B comprises a reactor 10 from which air can be evacuated, an anode 17 to which is secured a vapor-deposition substrate 20 on which vapor is to be deposited, a cathode 18 connected to an rf oscillator 24 (with a frequency of 13.56 MHz), a permanent magnet assembly 22 for inducing a magnetron discharge, a heater 19 for heating the vapor-deposition substrate 20, and a reactant gas 21 for the vapor-deposition of a thin film. The apparatus deposits a film of a material such as aluminum on the substrate 20 as follows. First the reactor 10 is evacuated by means of a pump; then a reactant gas 21 is introduced at a pressure of 2.3 Torr, and 13.56 MHz high-frequency power is applied to the cathode 18 from the rf oscillator 24, ionizing the reactant gas 21 to create a plasma of positive ions and negative electrons. The applied electromagnetic waves also generate an alternating electric field oriented perpendicularly to the anode 17, while the permanent magnet assembly 22, which comprises two bar magnets, creates a magnetic field parallel to the anode in the position between the N and S magnetic poles. Intersecting orthogonally in the space above the substrate 20, the alternating electric field E and magnetic field B cause the lighweight electrons to spiral along the lines of magnetic force in a tight cyclotron motion during which they undergo high-energy collisions with the neutral etching gas 21, thereby generating a high-density plasma which induces a magnetron discharge.

The ionization rate of a normal rf discharge of the etching gas or reactant gas is only about $10^{-4}$. The ionization rate of a magnetron discharge is about $10^{-2}$, at least two orders of magnitude better, and the etch rate is improved by at least one order of magnitude. Moreover, there is improvement in both the deposition rate and the quality of the resulting film.

A problem in the prior art as shown in FIG. 1A is that the magnetic field B created above the material to be etched (e.g. the substrate 20) is nonuniform. Uniform substrate etching can be achieved only by scanning (reciprocating) the permanent magnet assembly 22 horizontally back and forth with respect to the substrate surface, but when permanent magnet assembly 22 is scanned horizontally, the magnetron discharge 26 also moves horizontally and this motion reduces the mean etch rate.

In an effort to overcome this problem two independent magnets have been used with the N-pole of one magnet facing the S-pole of the other inside the reactor. Although a uniform magnetic field can be produced in this way between the magnets, great skill and effort are demanded, and the extra space required to mount two magnets inside the reactor is hardly an advantage from the point of view of apparatus structure.

A similar problem arises in the prior art shown in FIG. 1B. The use of a pair of bar magnets in the permanent magnet assembly 22 creates a nonuniform magnetic field over the substrate 20, and vapor cannot be deposited uniformly on the substrate unless the permanent magnet assembly 22 is rotated in the horizontal plane. The pair of bar magnets in the permanent magnet assembly 22 also take up considerable space, making a compact apparatus configuration difficult to achieve.

SUMMARY OF THE INVENTION

The present invention is directed toward a solution of these problems of the prior art.

An object of the invention is therefore to provide dry process apparatus in which a uniform magnetic field is formed above the material to be processed without motion of the permanent magnet assembly parallel to the material, which material in a dry etching apparatus would be the material to be etched and in a sputtering apparatus would be the target material, thus enabling uniform etching or sputtering to be performed over substantially the entire surface of the material.

Another object of the invention is to provide compact dry-process apparatus capable of creating a uniform film by chemical vapor-deposition without motion of the permanent magnets.

The above objects are achieved in a dry process apparatus in which the material to be processed is situated on the cathode or on the anode by the following means:

The magnetic field is generated by a permanent magnet in the form of a ring or loop with an N-pole and an S-pole. Typically, the permanent magnet has an N-pole in one half of the ring and an S-pole in the other half of the ring. Lines of magnetic force extending from the N-pole to the S-pole are created in the vacant space within the ring and in the adjoining space.

This permanent magnet is mounted inside or outside the reactor. The mounting need not be made to permit a scanning motion of the magnet parallel to the material to be processed. It is preferable, however that, the magnet be mounted so that it can be rotated by suitable means in a plane parallel to the surface of the material to be processed, thus causing the magnetic field to rotate.

Mounted in this configuration, the permanent magnet generates a magnetic field in the space above the material to be processed and in particular in the region in which a magnetron discharge is desired. The magnetic field is essentially uniform and is oriented parallel to the material to be processed.

When this permanent magnet is mounted inside or outside the reactor in an embodiment of the invention, the permanent magnet and the material to be processed can be positioned at different relative heights or at the same height, but when viewed from above, the material to be processed should be situated in the vacant space inside the permanent magnet ring.

In a preferred embodiment of the dry process apparatus of the invention as a dry etching device or sputtering device, it is advantageous to have the permanent magnet mounted at the cathode. The permanent magnet can be mounted on either the upper surface or lower surface of the cathode surrounding the material to be etched or sputtered, or it can be partly or wholly embedded within the cathode.

When the dry process apparatus of the invention is used as a dry etching apparatus or a sputtering apparatus, it is preferable the permanent magnet be also mounted by suitable means in the space above the cathode.

In a dry etching apparatus, in particular, the permanent magnet can be mounted on an opposing anode situated facing the cathode, or in the space between such an anode and the cathode. If mounted on the anode, the permanent magnet can be located on either the upper or lower surface of the anode, or can be partly or wholly embedded within the anode.

A preferable arrangement in a sputtering apparatus embodying the invention is for the apparatus to have a cathode and an anode, for the permanent magnet to surround the target material, and for the vapor-deposition substrate to be located on the anode.

Another preferable configuration of dry process apparatus embodying the invention is to have separate permanent magnets located on the cathode and the opposing anode, with the N-poles of the two magnets facing each other.

In a preferred embodiment of the dry process apparatus of the invention, it is advantageous to mount the permanent magnet on the anode. The permanent magnet can be mounted on either the upper surface or lower surface of the anode surrounding the vapor-deposition substrate, or it can be partly or wholly embedded within the anode.

When the invention is embodied in a dry process apparatus, it is preferable the permanent magnet be also mounted by suitable means in the space above or below the anode at a distance from the anode.

When the invention is embodied in a dry process apparatus, the permanent magnet can also be mounted in the space between the cathode and the opposing anode.

When the invention is embodied in a dry process apparatus, the permanent magnet can also be mounted at a distance from the anode in the space on the opposite side of the anode from the opposing cathode.

In a preferred embodiment of the invention, the preferred shape of the permanent magnet ring is a circular ring, an elliptical ring, or a rectangular ring.

In a preferred embodiment of the invention, it is also preferred that the permanent magnet be electrically connected to the high-frequency power supply, or be electrically grounded.

In a preferred embodiment of the invention, an auxiliary magnetic member is disposed adjacent the permanent magnet to modify the magnetic field. The auxiliary magnetic member may be an auxiliary magnet having an N-pole adjacent to the S-pole of the permanent magnet, and an S-pole adjacent to the N-pole of the permanent magnet. The auxiliary magnetic member may alternatively be of a ferromagnetic material having no coercive-power. The auxiliary magnetic member may also be in the form of a ring extending along the permanent magnet.

The dry process apparatus of the invention uses as a device for generating a magnetic field a ring-shaped permanent magnet, the field generated by which is essentially uniform and parallel in the space inside and adjoining the ring. By means of this permanent magnet a magnetic field is generated in an arbitrary desired space above the material to be processed inside the reactor, the field being essentially parallel to the surface of the material. This magnetic field and a high-frequency alternating electric field combine to induce a magnetron discharge in this space, thereby creating a plasma of high density and uniformity above the material to be processed, which enables the process for which the device is intended, such as etching, sputtering, or chemical vapor-deposition, to be performed on the material at a fast rate with high uniformity.

Since the magnetic field is oriented essentially parallel to the surface of the material to be processed, electrons in the plasma do not tend to drift onto the material, so an ion sheath does not tend to form, and the self-bias voltage is reduced by a factor of approximately five or more with attendant reduction in the damage to the material caused by ion bombardment.

In embodiments in which the permanent magnet is mounted separately from the cathode or anode, or is embedded in the cathode or anode and does not protrude from the surface of the cathode or anode on the same side as the material to be processed, the flow of etching or sputtering gas or of chemical vapor-deposition gas over the surface of the material is improved, so the high-density plasma created by the magnetron discharge can be supplied with good uniformity to the material on which etching, sputtering, or chemical vapor-deposition is to be performed as intended in the particular apparatus.

BRIEF DESCRIPTION OF THE DRAWINGS

FIGS. 1A and 1B are schematic drawings of the prior art dry etching apparatus.

FIG. 9. is a schematic diagram of a further embodiment of the dry process apparatus of the invention.

FIG. 10A is a schematic diagram of a further embodiment of a dry process apparatus of the invention.

DETAILED DESCRIPTION OF THE PREFERRED EMBODIMENTS

Embodiments of the invention will now be described with reference to the drawings.

The drawings are schematic in nature, and are intended merely to explain the invention. They do not limit the invention to the component dimensions, shapes, and positional relationships shown. Components identical to components of the prior art shown in FIGS. 1A and 1B are labeled by the same reference numbers, and detailed descriptions of these components are omitted.

The descriptions of the embodiments of the dry process apparatus of the invention given below will treat mainly the case of a dry etching apparatus, but it will be clear that the invention can also be applied to a sputtering apparatus, and a chemical vapor-deposition apparatus.

Examples of the Permanent Magnet

Figure 2A:
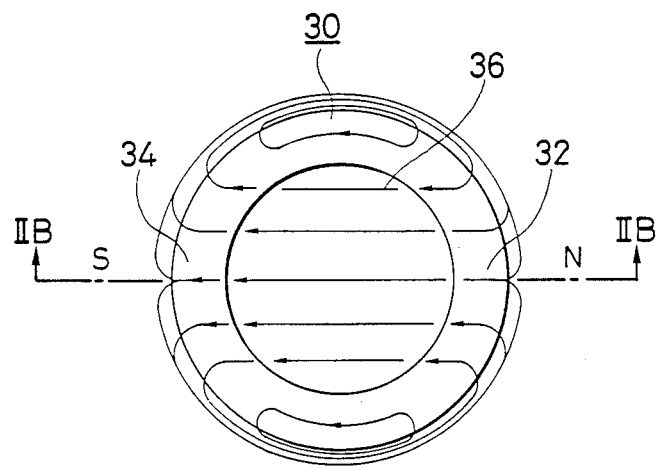
FIGS. 2A and 2B are plan and cross-sectional views of the permanent ring magnet used in an embodiment of the invention.
Figure 2B:
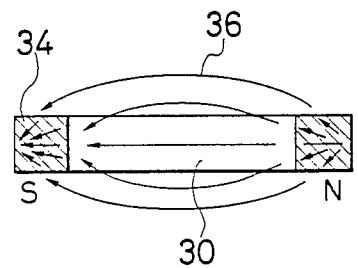

One preferred example of the permanent magnet incorporated in the dry process apparatus of the invention for generating the magnetic field is presented in plan view in FIG. 2A, and in cross-sectional view through the line IIB—IIB in FIG. 2B. The permanent magnet 30 has the shape of a circular ring and is divided by one of its diameters into two sections, which are magnetized so that the magnetic N-pole 32 is located in one section and the magnetic S-pole 34 is located in the other. Lines of magnetic force 36 (indicated in the drawings by solid lines with arrows) extend from the N-pole to the S-pole, mainly in the vacant space within the ring and in the adjoining space. In plan view these lines of force 36 are substantially parallel and are of substantially uniform intensity. The circular ring shape shown in the drawings is only one possible shape of the permanent magnet; square, rectangular, and elliptical shapes are also possible.

First Embodiment

FIGS. 3A to 3D show an example of dry etching apparatus configured to produce a magnetron discharge by means of a permanent magnet having the shape of a circular ring. The permanent magnet 30 is attached to the cathode 18.

Figure 3A:
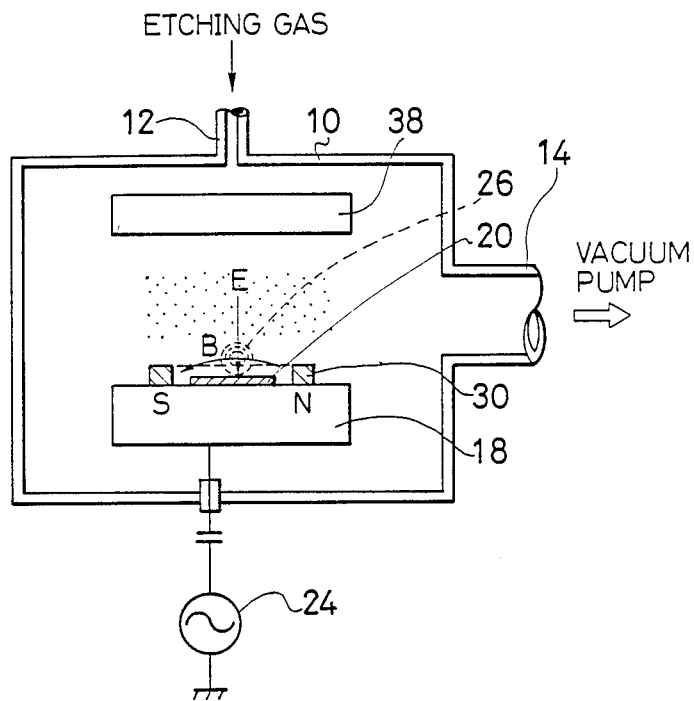
FIG. 3A is a schematic diagram of an embodiment of a dry process apparatus of the invention.

In the example shown in FIG. 3A, the cathode 18 faces an anode 38 inside the reactor 10, and the anode 38 is grounded. In this embodiment the permanent magnet 30 is mounted on the surface of the cathode 18 facing the anode 38. The material to be etched, such as a substrate (or wafer) 20, is placed in the space inside the ring of the permanent magnet 30. In the particular example shown in FIG. 3A, the permanent magnet 30 is mounted so that it surrounds the substrate 20.

When 13.56 MHz electromagnetic waves are applied to the cathode 18 from the rf oscillator 24, a high-frequency alternating electric field E is produced in the space above the cathode 18, oriented substantially perpendicular to the cathode 18, hence to the substrate 20. This alternating electric field E interacts with the magnetic field B formed between the N- and S-poles of the permanent magnet 30 to induce a magnetron discharge 26 (indicated by dashed circles). The plasma intensity in the region of this magnetron discharge 26 is proportional to the intensity of the alternating electric field E and the intensity of the magnetic field B. Since both the alternating electric field E and the magnetic field B have substantially uniform intensity distributions over the substrate 20, the plasma intensity is also substantially uniform.

The ionization rate of the magnetron discharge of the plasma is at least two orders of magnitude higher than the ionization rate of an rf discharge. The etch rate of the device in this embodiment is therefore at least one order of magnitude higher than in the prior art, and the etching is highly uniform.

Figure 3B:
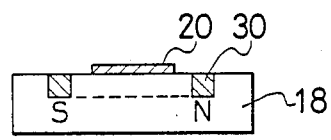
FIGS. 3B through 3D illustrate the mounting of the permanent ring magnet with respect to the cathode.
Figure 3C:
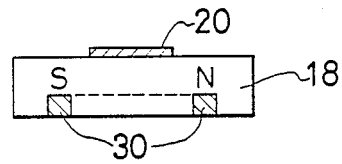
Figure 3D:
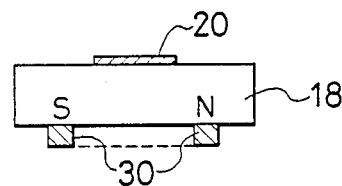

Instead of being mounted on the cathode 18 as described above, the permanent magnet 30 can be mounted as shown, for example, in FIGS. 3B through 3D. These drawings show only the mounting. In FIG. 3B the permanent magnet 30 is embedded in the cathode 18 on the same side as the substrate 20; in FIG. 3C it is embedded in the cathode 18 on the opposite side from the substrate 20; in FIG. 3D it is mounted on the surface of the cathode 18 on the opposite side form the substrate 20. In FIG. 3D the permanent magnet 30 can also be mounted at a distance from the cathode 18. In any of these positions, the permanent magnet 30 is able to generate a substantially uniform, parallel magnetic field orthogonally intersecting an alternating electric field in a suitable region of space inside the reactor adjacent to the substrate. The mounting configurations shown in FIGS. 3B through 3D improve the flow of etching gas over the substrate surface, as already explained, enabling a highly uniform high-density plasma to be produced by magnetron discharge over the substrate.

Second Embodiment

In FIGS. 4A to 4D the permanent magnet 30 is situated in the space above the cathode 18. In this particular example the permanent magnet 30 is attached to the anode 38. In the configuration shown in FIG. 4A the permanent magnet 30 is mounted on the surface of the anode 38 facing the cathode 18. In this configuration as well, a substantially uniform, parallel magnetic field B orthogonally intersecting an alternating electric field E is generated in the space between the anode 38 and the cathode 18, giving rise to a magnetron discharge in an appropriate region in this space.

In the configuration of this embodiment, a higher-density plasma can be formed by the magnetron discharge 26 in the region adjacent to the substrate surface by reducing the gap between the anode 38 and cathode 18. This configuration also improves the flow of etching gas, enabling the high-density plasma produced by the magnetron discharge to be supplied with good uniformity to the material to be etched.

Figure 4A:
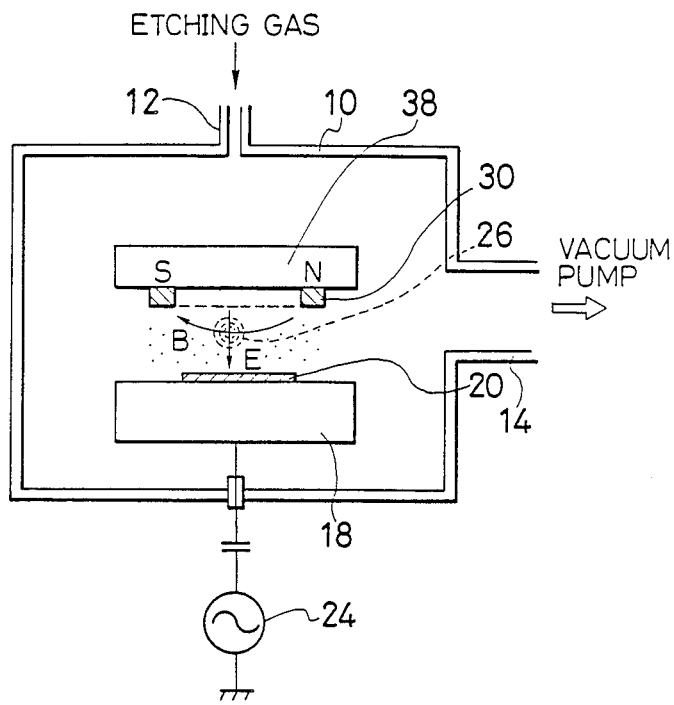
FIG. 4A is a schematic diagram of another embodiment of a dry process apparatus of the invention.
Figure 4B:
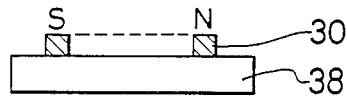
FIGS. 4B through 4D illustrate the mounting of the permanent ring magnet with respect to the anode.
Figure 4C:
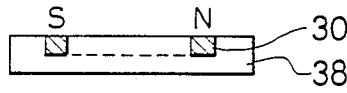
Figure 4D:
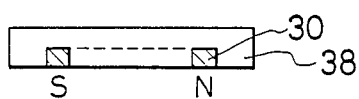

In this embodiment the permanent magnet 30 can also be mounted on the surface of the anode 38 away from the cathode 18 as in FIG. 4B, or can be embedded in the side of the anode 38 away from the cathode 18 as in FIG. 4C, or can be embedded in the side of the anode 38 near the cathode 18 as in FIG. 4D. In FIG. 4B, the permanent magnet 30 can also be mounted at a distance from the anode 38.

Third Embodiment

Figure 5:
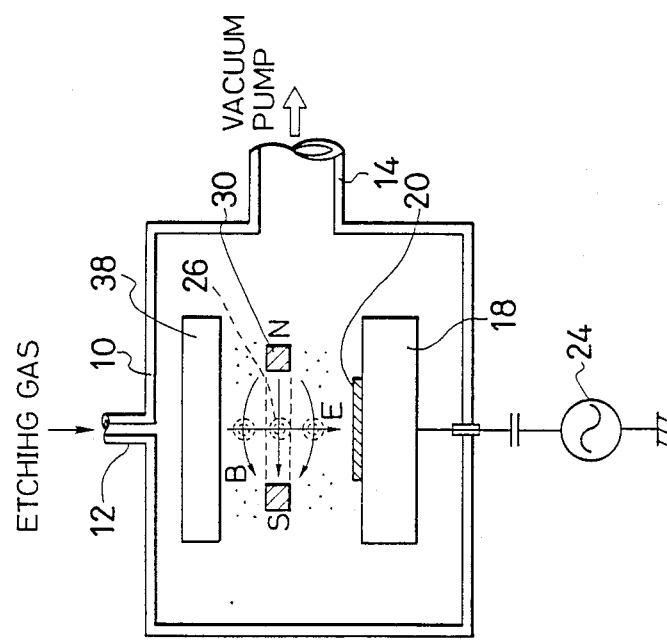
FIG. 5 is a schematic diagram of a further embodiment of a dry proces apparatus of the invention.

FIG. 5 shows another configuration in which the permanent magnet 30 is mounted in the space above the cathode 18. In this particular configuration the permanent magnet 30 is mounted by an appropriate means (not shown in the drawing) in the space between the cathode 18 and the anode 38. The mutual separation of the cathode 18, the anode 38, and the permanent magnet 30 in this type of configuration reduces turbulence in the flow of etching gas to the surface of the substrate 20, improving the planar distribution of the etch rate and facilitating the venting away of gas produced by the etching process, thereby resulting in a higher etch rate.

In this configuration the planar uniformity of the etch rate is affected by the electrical potential of the permanent magnet 30, so the electrical potential of the permanent magnet 30 is an important factor. Three simple alternatives are to tie the permanent magnet 30 to the same ground potential as the anode 38, or to the same high-frequency potential as the cathode 18, or to leave it at a floating potential in which its only electrical contact is with the plasma. The preferred choice is to leave the permanent magnet 30 at a floating potential, if it is desired to minimize distortion of the electric field around the permanent magnet 30.

Fourth Embodiment

Figure 6:
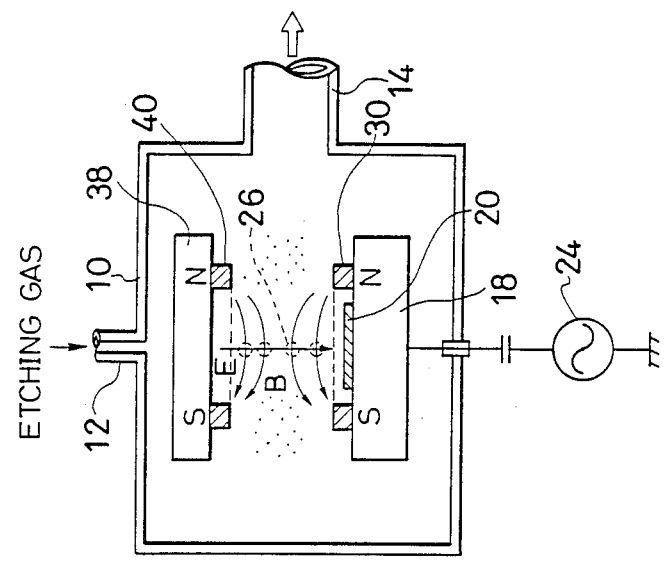
FIG. 6 is a schematic diagram of a further embodiment of a dry process apparatus of the invention.

In FIG. 6 the permanent magnet 30 is mounted on the cathode 18 and another permanent ring magnet 40 is mounted on the anode 38. In this particular example, the permanent magnets 30 and 40 are situated on facing sides of the cathode 18 and anode 38. In this case the permanent magnets 30 and 40 should preferably be positioned so that their respective N-poles face each other and their respective S-poles face each other. Because the two permanent magnets 30 and 40 are situated with like poles facing in the same direction, the lines of force generated by the two permanent magnets repel each other, creating a still more uniform magnetic field above the substrate, enabling a higher plasma density to be achieved. Etching can therefore be performed with greater speed and uniformity. The permanent magnets 30 and 40 in this example can also be mounted as shown in FIGS. 3B through 3D and FIGS. 4B through 4D.

Fifth and Sixth Embodiments

Figure 7:
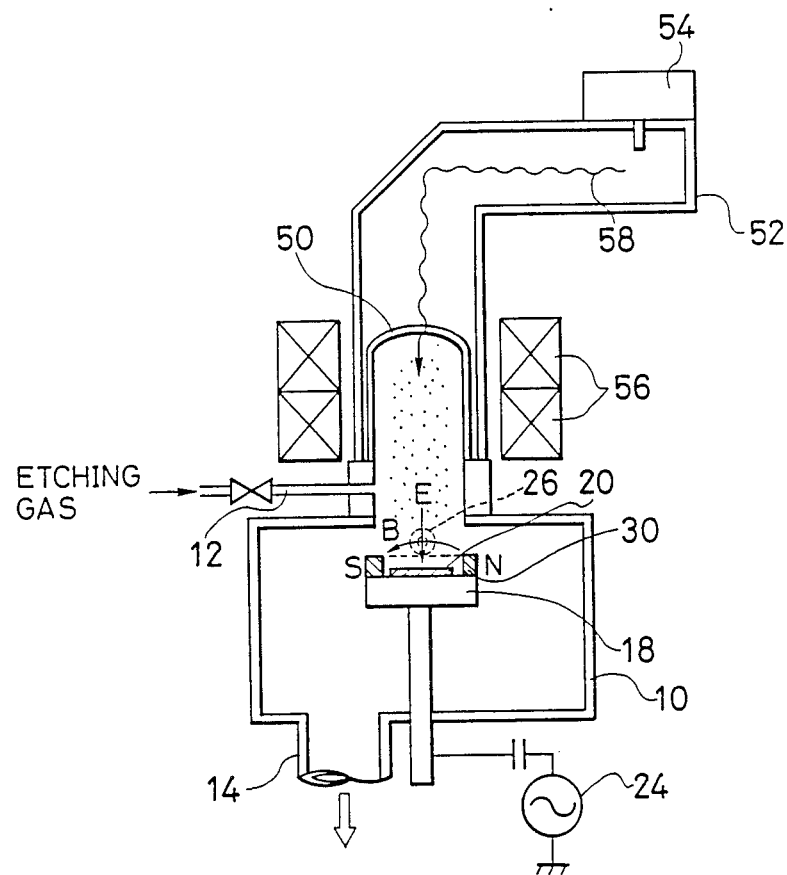
FIGS. 7 and 8 are schematic diagrams of a further embodiments of a dry process apparatus of the invention.
Figure 8:
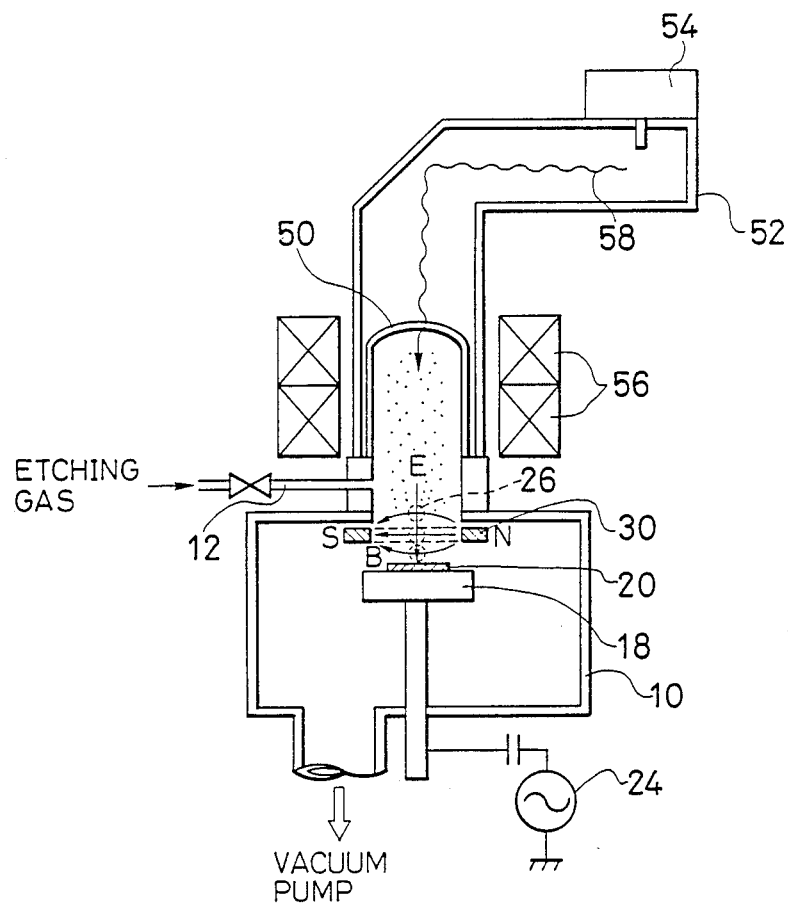

FIG. 7 and FIG. 8 show the fifth and sixth embodiments of this invention, in which the dry etching apparatus uses microwaves to ionize the etching gas to create a plasma. Normally in this type of dry etching apparatus the reactor 10 itself is grounded and acts as the cathode. Of the components shown in these two drawings, those that are identical to components shown in earlier drawings are given identical reference numbers, and detailed explanations of these components are omitted. First the components common to the embodiments in both FIGS. 7 and 8 will be explained. The reactor 10 is joined to a quartz tube 50 situated above the cathode 18 and opening into the space inside the reactor 10. The quartz tube 50 is inserted into one end of a waveguide 52, the other end of which is equipped with a magnetron 54. A solenoid coil 56 surrounds the section of the waveguide 52 containing the quartz tube 50. This structure is identical with the structure of the prior art.

In the embodiment of this invention shown in FIG. 7, the permanent magnet 30 is a ring, which may be circular in shape, mounted on the same side of the cathode 18 as the substrate. The permanent magnet 30 could, however, be mounted in any of the positions shown in FIGS. 3B through 3D with respect to the cathode.

When this apparatus is operated, 2.45 GHz microwave radiation 58 produced by the magnetron 54 is guided by the waveguide 52 into the etching chamber formed by the quartz tube 50 attached to the reactor 10. Etching gas is introduced into the reactor 10 via the etching gas inlet 12. If an 875-Gauss magnetic field is created by the solenoid coil 56, cyclotron resonance of the electrons inside the quartz tube 50 generates an excited plasma.

The diffuse magnetic field causes the plasma created inside the quartz tube 50 to flow to the substrate 20 to be etched. Application of 13.56 MHz high-frequency electromagnetic waves to the cathode 18 generates an alternating electric field E oriented perpendicularly to the substrate 20, which interacts with the magnetic field B of the permanent magnet 30 to induce a magnetron discharge 26 in the space over the cathode 18. As in the embodiments already described, the result is that a uniform, high-density plasma is created over the substrate, which can accordingly be etched uniformly at a high rate.

The embodiment shown in FIG. 8 differs from the embodiment shown in FIG. 7 in that the permanent magnet 30 is located at a distance above the cathode 18, so that the region inside and adjoining the permanent magnet ring is located over the substrate 20. The separation of the permanent magnet 30 from the substrate 20 has the effect noted in the third embodiment of increasing the etch rate. The positional relation of the permanent magnet 30 and cathode 18 can also be as shown in FIGS. 3B through 3D.

Seventh Embodiment

In FIG. 10A the material to be processed is a substrate 20 on which chemically reactive vapor is to be deposited. This substrate is placed on the anode 38, to which the permanent ring magnet 30 shown in FIGS. 2A and 2B is attached to produce a magnetron discharge.

In the embodiment shown in FIG. 10A the anode 38 and cathode 18 are mounted facing each other inside the reactor 10, and the anode 38 is grounded. The permanent magnet 30 is mounted on the surface of the anode 38 near the cathode 18. The substrate 20 on which chemically reactive vapor is to be deposited is placed in the vacant space inside the ring of the permanent magnet 30. In the embodiment shown in FIG. 10A the permanent ring magnet 30 is mounted so that it surrounds the substrate 20.

When 13.56 MHz electromagnetic waves are applied to the cathode 18 from the rf oscillator 24, a high-frequency alternating electric field E is generated below the cathode 18, oriented substantially perpendicularly to the anode 38, hence to the chemical vapor-deposition substrate 20. This alternating electric field E interacts with the magnetic field B formed between the N-and S-pole of the permanent magnet 30 to produce a magnetron discharge 26 (indicated by dashed circles). The plasma intensity in the region of this magnetron discharge 26 is proportional to the intensity of the alternating electric field E and the intensity of the magnetic field B. Since both the alternating electric field E and the magnetic field B have substantially uniform intensity distributions over the substrate 20, the plasma intensity is also substantially uniform.

Because the anode 38 is grounded, the reaction products formed in the plasma are deposited in a film. A dc bias or a high-frequency (rf) electric field can be applied to the anode 38 if it is desired to vapor-deposit a film while sputtering it with ions.

Figure 10B:
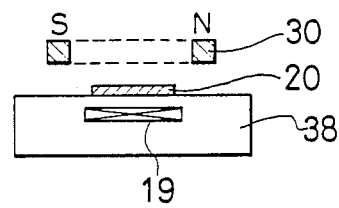
FIGS. 10B through 10F illustrate the mounting of the permanent ring magnet with respect to the anode.
Figure 10C:
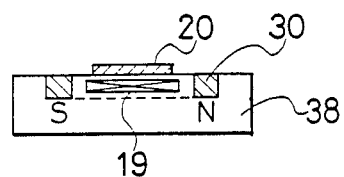
Figure 10D:
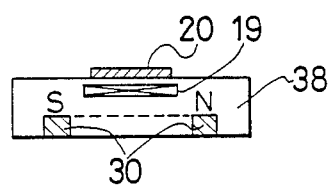
Figure 10E:
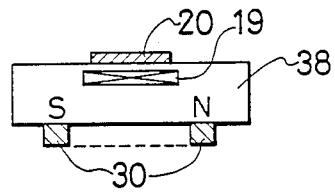
Figure 10F:
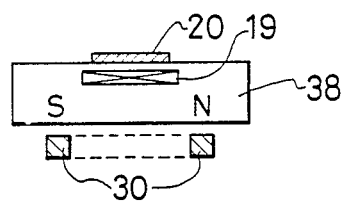

Other positionings of the permanent magnet 30 with respect to the anode 38 are also possible, such as those shown in FIGS. 10B through 10F. These drawings show only the relevant components. In FIG. 10B the permanent magnet 30 is located above the surface of the anode 38 on which the substrate is placed; in FIG. 10C it is embedded in the anode 38 on the same side as the substrate; in FIG. 10D it is embedded in the anode 38 on the opposite side from the substrate; in FIG. 10E it is mounted on the surface of the anode 38 on the opposite side from the substrate; and in FIG. 10F it is located beneath the anode 38 on the opposite side from the substrate. In any of these positions, the permanent magnet 30 is able to generate a substantially uniform, parallel magnetic field orthogonally intersecting an alternating electric field in a suitable region of space inside the reactor adjacent to the substrate. The mounting configurations shown in FIGS. 10B to 10F improve the flow of reactant gas over the vapor-deposition substrate surface, enabling a highly uniform high-density plasma to be produced by magnetron discharge over the substrate.

Modifications

The present invention is not limited to the embodiments described above, but admits of many variations and modifications.

For example, the apparatus shown in FIGS. 3A to 3D, 4A to 4D, 5, and 6 can be used as sputtering apparatus by placing the substrate on which sputtered material is to be deposited on the anode and mounting the permanent ring magnet directly on the cathode around the target placed on the cathode and/or the anode to generate a high-density plasma which enables the sputtering deposition process to proceed at a high rate. Instead of being mounted directly on the cathode the permanent ring magnet can be mounted a slight distance above the cathode to genetate a high-density plasma. This arrangement improves the flow of sputtering gas, enabling the sputtering deposition process to proceed with high uniformity and a high rate. The anode can be positioned at a suitable location within the reactor.

Figure 11:
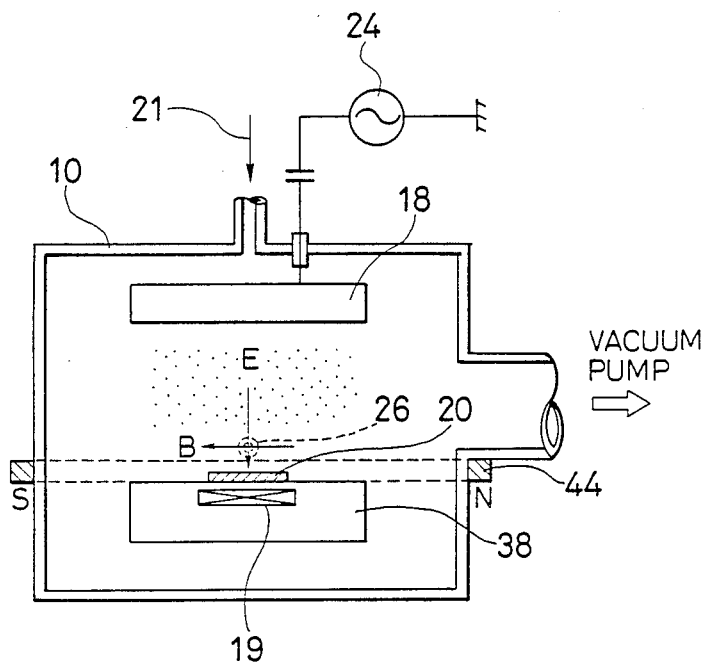
FIG. 11 is a schematic diagram of a further embodiment of the dry process apparatus of the invention.

In the embodiments described so far the permanent ring magnet has been situated inside the reactor, but this is not the only possible arrangement: the permanent magnet can also be placed outside the reactor. Such a configuration is shown in FIGS. 9 and 11. The permanent ring magnet 42 or 44 should be located in an appropriate position outside the reactor so that the lines of force of the magnetic field B run approximately parallel to the cathode 18 or anode 38 in the space above the cathode 18 or anode 38.

In the dry process apparatus of the various embodiments described above the permanent magnets were stationary, but the permanent ring magnet can be rotated around its center of rotational symmetry or center of gravity in the plane of the ring to cause the magnetic field to rotate in a plane substantially orthogonal to the plane of the alternating electric field. This results in a still more uniform plasma intensity distribution over the material to be etched, the sputtering target material, or the material on which vapor is to be deposited, leading to greater uniformity of the etch rate, sputter rate, or vapor-deposition rate. No restrictions are placed on the means of rotating the permanent magnet in this case. Such means can easily be provided by existing techniques. When the permanent magnet is mounted on the cathode or anode, for example, it suffices to provide means of rotating the cathode or anode without rotating the material 20. When the permanent magnet is not mounted on the cathode or anode, the support structure of the permanent magnet can be used for mechanical rotation control, or the rotation can be controlled by electromagnetic means from outside the reactor by employing the repulsive force of the magnet. The rate of rotation is not critical. When permanent magnets are mounted on both the cathode and anode as described previously, the rotation of the two magnets should be synchronized so that their N-poles remain in opposition and their S-poles remain in opposition.

Figure 18:
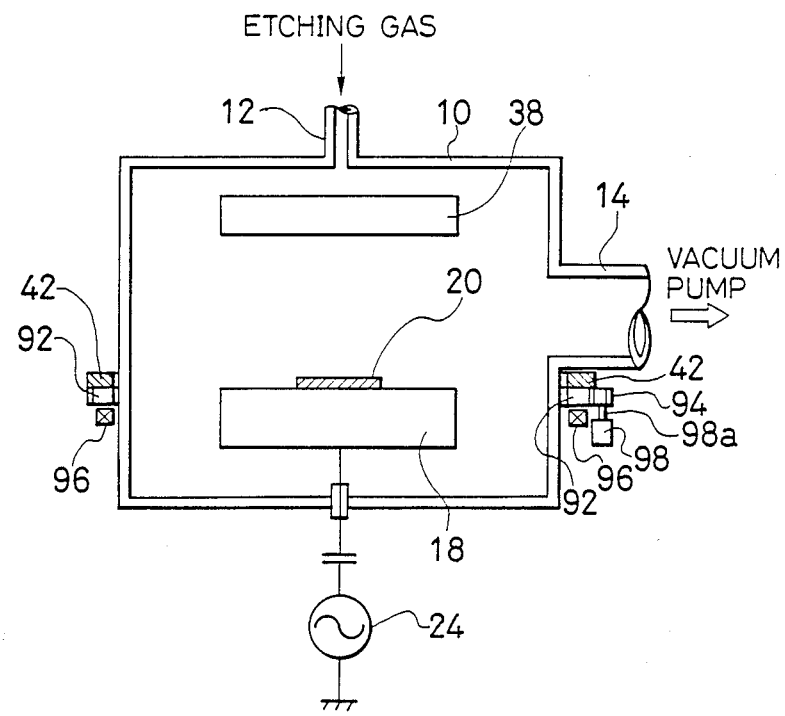
FIG. 18 shows an arrangement for rotating the permanent magnet.

When the magnet is placed outside of the reactor, an arrangement as shown in FIG. 18 can be used for rotation of the permanent magnet. The arrangement includes a first gear 92 on which a permanent magnet 42 is mounted, and a second gear 94 meshing with the first gear 92. The first gear 92 is supported rotatably by a bearing member 96 having ball bearings arranged along a circumference. The second gear is fixed to the shaft 98a of a motor 98. When the motor 96 is driven, the rotation is transmitted to the second gear 94 and hence the first gear 92. The permanent magnet 42 is thereby rotated.

If necessary, the permanent magnet used in this apparatus can be electrically connected to the high-frequency (rf) power supply or can be electrically grounded to maintain the perpendicular orientation of the electric field (field vector) to the cathode.

This invention is characterized by the use of a permanent ring magnet to generate the magnetic field necessary to produce a magnetron discharge, and by the positional relationships of the magnet. The structure of other parts of the dry process apparatus can be modified to suit the design without being restricted to the structures described above.

Permanent Magnet with an Auxiliary Magnetic Member

Figure 12A:
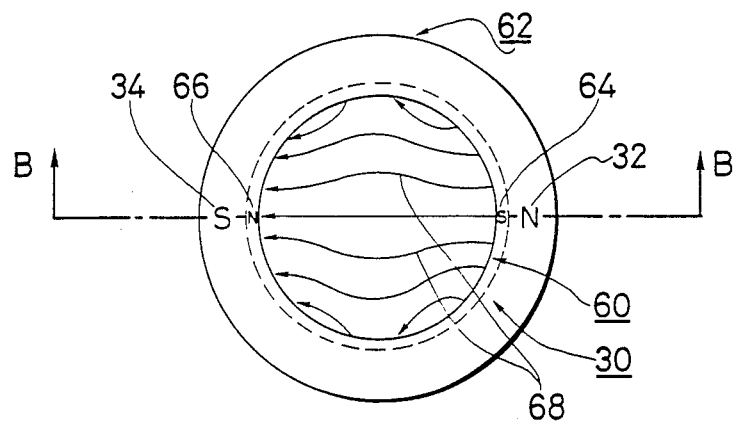
FIGS. 12A and 12B shows an example of magnet assembly including an auxiliary magnetic member.
Figure 12B:
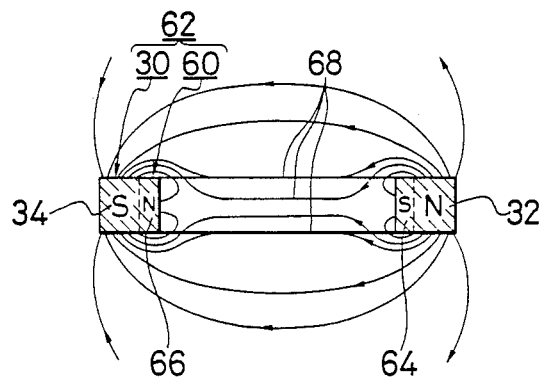

The ring permanent magnet featuring the invention can be used in combination with an auxiliary magnetic member. An example of such a combination is shown in FIGS. 12A and 12B. In this example, the auxiliary magnetic member, denoted by reference numeral 60 is in the form of a ring disposed inside of and in contact with the ring magnet 30. The auxiliary magnetic member 60 and the permanent magnet 30 form a magnet assembly 62.

The auxiliary magnetic member 60 can be made of a permanent magnet having an N-pole adjacent the S-pole of the permanent magnet 30 and an S-pole adjacent the N-pole of the permanent magnet 30.

Figure 12C:
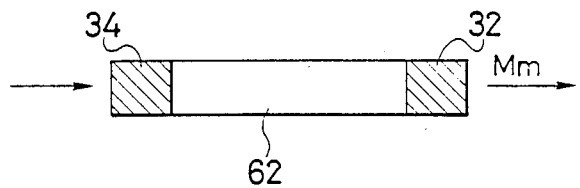
FIG. 12C shows the manner of forming the magnetic assembly of FIGS. 12A and 12B.

The auxiliary magnetic member 30 can be formed as an integral member, as shown in FIGS. 12A and 12B. To produce the structure shown in FIGS. 12A and 12B, a magnet material in the form of a ring or loop is magnetized by application of an external magnetic field Mm by an electromagnet as shown in FIG. 12C, with magnetic field lines in the plane of the loop directed from the desired S-pole to the desired N-pole to form the N-pole 32 and the S-pole 34 of the main permanent magnet 30. Upon removal of the external magnetic field, the inside parts of the ring adjacent the N-pole 32 and the S-pole 34 of the main permanent magnet 30 are spontaneously magnetized to result in the S-pole 64 and the N-pole 66 of the auxiliary permanent magnet 60. The magnet assembly 62 is thus divided into the main permanent magnet 30 and the auxiliary permanent magnet 60 which are both in the form of a ring. The boundary between the magnet layers 30 and 60 are roughly indicated by the dashed line.

A suitable material which can be used for the formation of the magnet assembly 60 is alnico containing mainly Al, Ni, Co and Fe. The content of Co should preferably be about 30%. With such a high content of Co, the coercive power or coercive force is more than about 1,000 Gauss. When the content of Co is about 25%, the coercive force is less than about 1,000 Gauss and the formation of the N-pole and the S-pole of the auxiliary permanent magnet layer 60 respectively opposing S-pole 34 and the N-pole 32 does not occur. Therefore, when the coercive force is low magnetic poles of the same polarities as the adjacent poles 32 and 34 of the main magnet 30 are spontaneously formed.

With the structure as shown in FIGS. 12A and 12B, the lines of magnetic force induced in the vacant space of the ring will have an improved uniformity as seen in the plan view (FIG. 12A) and as seen in the cross section (FIG. 12B). The lines of magnetic force 68 also have a better parallelism as seen in the cross section (FIG. 12B).

Figure 13A:
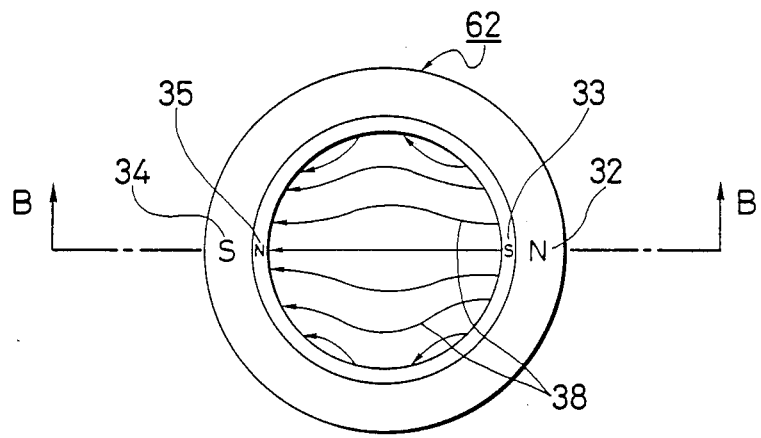
FIGS. 13A, 13B, 14A, 14B, 15A, 15B, 16A, 16B, 17A and 17B show further examples of magnet assemblies which can be used in place of the single magnet alone in the various embodiments of the invention.
Figure 13B:
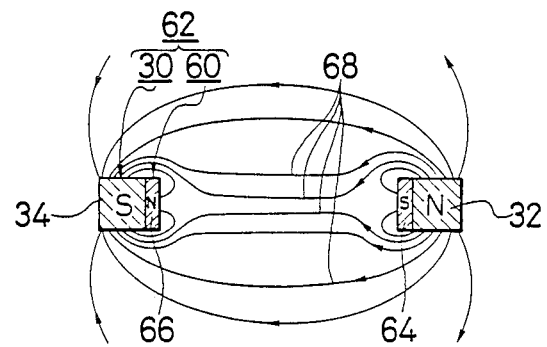

FIGS. 13A and 13B show another example of a magnet assembly. In FIGS. 13A and 13B, members and parts identical to those shown in FIGS. 12A and 12B are denoted by identical reference numerals. The magnet assembly 62 of this example comprises a main auxiliary permanent magnet 30 and an axiliary permanent magnet 60 which are separately magnetized and then assembled, that is the auxiliary permanent magnet 60 is fitted in the main permanent magnet layer 30. The boundary between the main permanent magnet 30 and the auxiliary permanent magnet 60 is indicated by a solid line. The magnetic field due to the outer main permanent magnet layer 30, if taken alone, is more intense than the magnetic field due to the inner auxiliary permanent magnet 60 taken alone. With this structure, the coercive-power of the premanent magnet 30 or 60 is not critical. The resultant lines of magnetic force are similar to those of FIGS. 12A and 12B.

Instead of the permanent magnet, the auxiliary magnetic member 60 can be made of a ferromagnetic material having no coercive-force. An example of such a material is iron. The assembly is shown in FIGS. 14A and 14B.

The part of the auxiliary magnetic member 60 adjacent the N-pole 32 of the permanent magnet 30 is magnetized to exhibit an S-pole 64 on its inner peripheral surface, while the part of the auxiliary magnetic member 60 adjacent the S-pole 34 of the permanent magnet 30 is magnetized to exhibit an N-pole 66 on its inner peripheral surface.

Figure 14A:
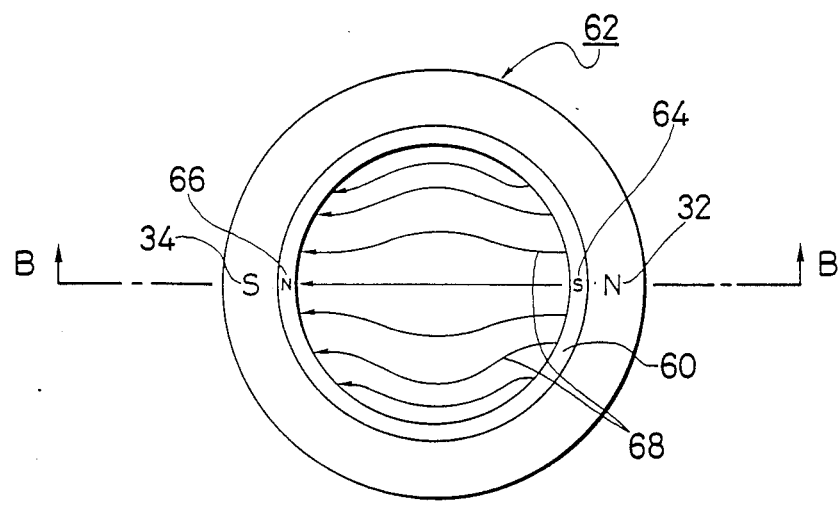
Figure 14B:
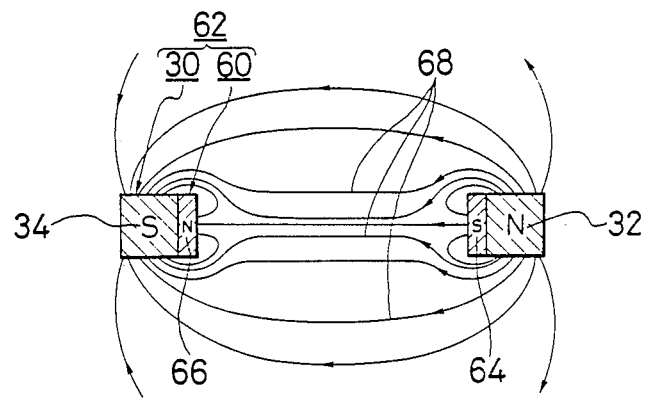

The lines of the magnetic force induced by the magnet assembly of FIGS. 14A and 14B are similiar to those shown in FIGS. 12A, 12B, 13A and 13B. That is, they have an improved uniformty in the vacant space in the ring as seen in the plan view (FIG. 14A) and as seen in the cross section (FIG. 14B). The lines of magnetic force 68 also have a better parallelism as seen in the cross-sectional view (FIG. 14B).

The ring permanent magnet and the ring auxiliary magnetic member can be divided into pieces arranged with gaps between the adjacent pieces, as far as the magnetic porperty and function of the assembly are maintained. The gaps may be filled with non-magnetic material that does not alter the magnetic property of the assembly.

Figure 15A:
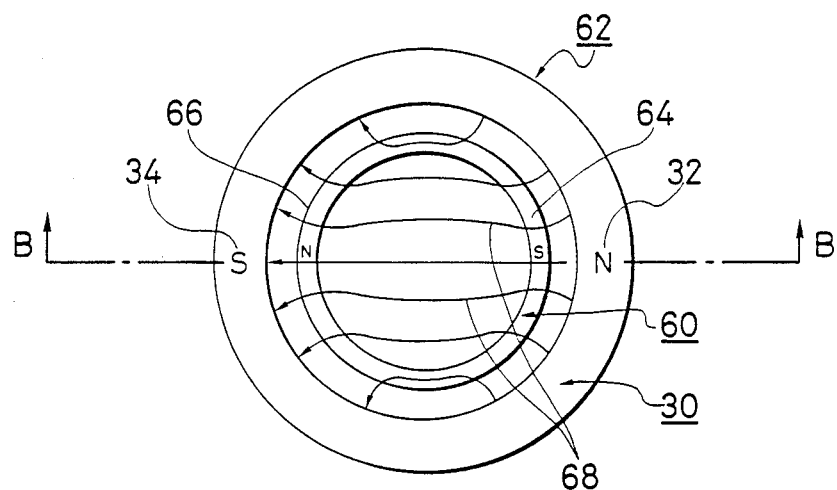
Figure 15B:
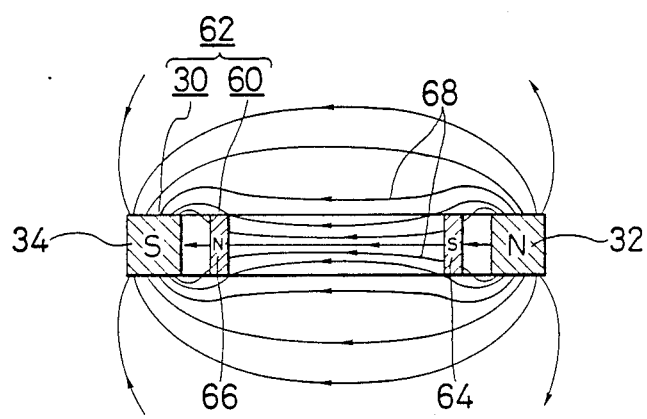

FIGS. 15A and 15B show another example of the magnet assembly, in which members or parts similar to those in FIGS. 14A and 14B are denoted by identical reference numerals. The example of FIGS. 15A and 15B differs from that of FIGS. 14A and 14B in that there is a greater difference in the diameter so that the auxiliary magnetic member 60 is separated from the permanent magnet 30. By adjusting the space between the auxiliary magnetic member 60 and the permanent magnet 30, the uniformity and intensity of the magnetic field can be adjusted. Moreover, by changing the vertical position of the auxiliary magnetic member 60 with respect to the permanent magnet 30, the uniformity and intensity of the magnetic field can also be adjusted. The uniformity and intensity of the magnetic field can be also adjusted by varying the shape of the auxiliary magnetic member 60 from the shape of the permanent magnet 30.

Figure 16A:
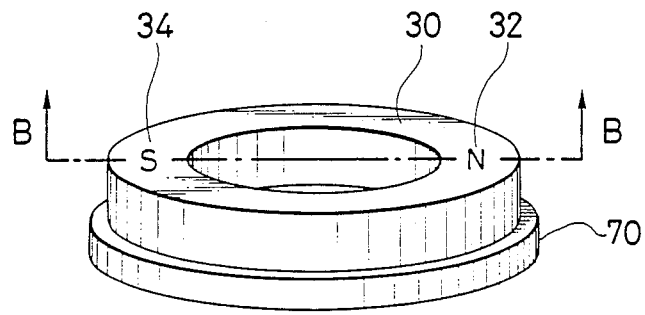
Figure 16B:
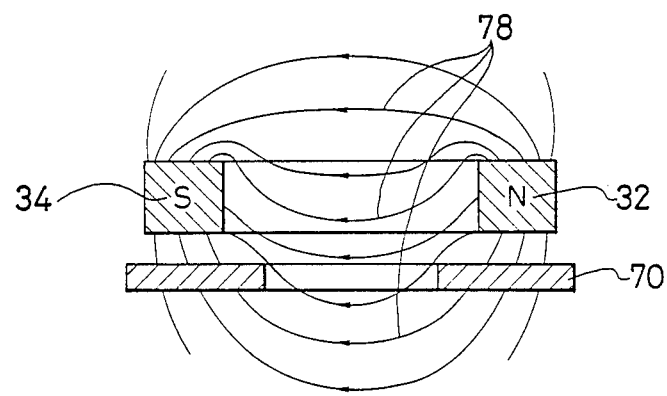

FIGS. 16A and 16B show another example of the magnet assembly. In this example, an auxiliary magnetic member 70 has a larger outer diameter than the permanent magnet 30 and a smaller inner diameter than the permanent magnet 30, and is positioned beneath the permanent magnet 30. The lines of magnetic force 78 are deviated downward and the density of the lines of magnetic force 78 in the upper and central regions can be varied, by varying the relative position of the auxiliary magnetic member 70 with respect to permanent magnet 30.

As an alternative, the auxiliary magnetic member 70 can be positioned above the permanent magnet 30.

Figure 17A:
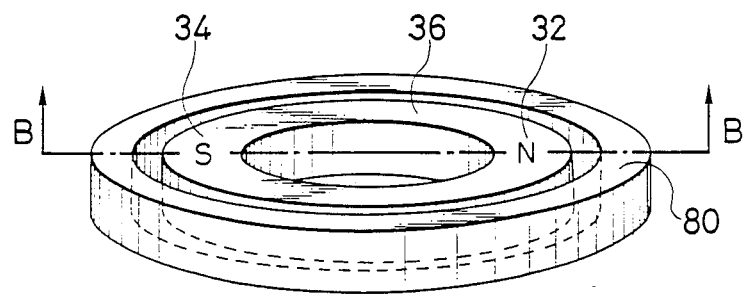
Figure 17B:
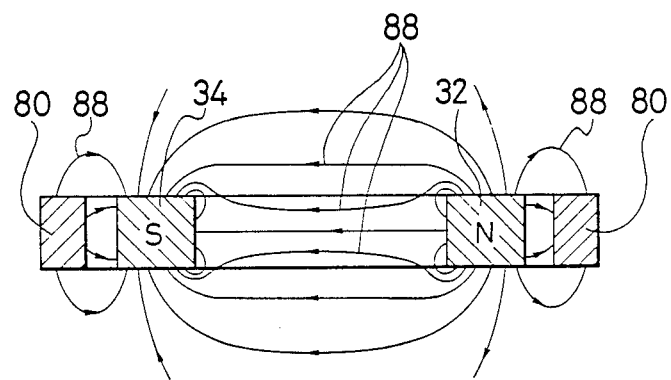

FIGS. 17A and 17B show a further example of the magnet assembly. In this example, an auxiliary magnetic member 80 has a larger diameter than the permanent magnet 30 and is positioned outside the permanent magnet 30. There is a separation between the inner periphery of the auxiliary magnetic member 80 and the outer periphery of the permanent magnet 30. In this structure, some of the lines of magnetic force 88 follow the auxiliary magnetic member 80 outside the permanent magnet 30. The intensity of the magnetic field inside the permanent magnet 30 can therefore be varied.

The arrangements of FIGS. 16A, 16B, 17A, 17B can be employed to compensate for the difference in the strength of magnetization of the individual permanent magnets, due for example to fluctuation in the conditions under which the individual permanent magnets are fabricated.

The magnet assembly described above can be used in substitution of the magnet alone as used in the various embodiments described above.

As is clear from the description above, the dry process apparatus of this invention is capable of producing a highly uniform magnetic field in the region inside and adjoining a permanent ring magnet, hence of generating a high-density plasma with a high degree of uniformity over a material such as a material to be etched, a target material, or a material on which vapor is to be deposited. The process of etching or sputtering the material or depositing a thin film on it can therefore be accomplished at a high rate with high uniformity.

Since the magnetic field produced in the dry process apparatus is oriented essentially parallel to the surface of the material to be processed, electrons in the plasma do not tend to drift onto the material, so an ion sheath does not tend to form (i.e. it is reduced), and the selfbias voltage is reduced by a factor of five or more with attendant reduction in the damage to the material caused by ion bombardment. The dry process apparatus of this invention is therefore particularly suited for low-damage etching, for gates that require high vapor-deposition rates, for trench etching, and for deposition of interconnecting materials.

This invention also enables the size of the apparatus to be reduced.

What it claimed is:

1. A dry process apparatus comprising
   a reactor,
   a first electrode and a second electrode, mounted in spaced relation to each other inside said reactor, said first electrode being provided to mount a material to be processed thereon between said first and second electrodes,
   an electric power supply electrically connected to one of said first electrode and said second electrode, to create an electric field, and
   means for generating a magnetic field that interacts with the electric field to induce a magnetron discharge in a space above the material to be processed,
   wherein said means for generating the magnetic field is a permanent magnet in the form of a continuous loop of permanently magnetized material with an N-pole and an S-pole opposite said N-pole.

2. A dry process apparatus as set forth in claim 1, wherein said first electrode has a surface facing said space and said permanent magnet is disposed so as to produce the magnetic field parallel to said surface in said space.

3. A dry process apparatus as set forth in claim 1, further comprising a dc power supply, wherein the other of said first and second electrodes is electrically connected to a said dc power supply.

4. A dry process apparatus as in claim 1, wherein said loop is circular.

5. A dry process apparatus as in claim 1, wherein said first electrode has an inner periphery and an outer periphery radially outward of said inner periphery, said first electrode being disposed to mount the material to be processed within the inner periphery of said loop as viewed in a direction normal to said loop.

6. A dry process apparatus as in claim 5, wherein said first electrode has a surface facing said space and said permanent magnet extends in a plane parallel to said surface.

7. A dry process apparatus as in claim 6, wherein said permanent magnet is rotatably disposed inside of said reactor for rotation in said plane.

8. A dry process apparatus as set forth in claim 7, wherein said permanent magnet is mounted on said first electrode.

9. A dry process apparatus as set forth in claim 7, wherein said permanent magnet is disposed above said first electrode.

10. A dry process apparatus as set forth in claim 9, wherein said permanent magnet is mounted on said second electrode.

11. A dry process apparatus as set forth in claim 9, wherein said permanent magnet is mounted in the space between said first and second electrodes.

12. A dry process apparatus as set forth in claim 7, wherein said permanent magnet is disposed below said first electrode.

13. A dry process apparatus as set forth in claim 7, wherein said permanent magnet is mounted on said first electrode and said apparatus further comprises an additional permanent magnet in the form of a loop of permanently magnetized material mounted on said second electrode, the N-poles of both permanent magnets being aligned with each other and the S-poles of both permanent magnets being aligned with each other.

14. A dry process apparatus as set forth in claim 7, wherein said permanent magnet has the shape of one of a circular loop, an elliptical loop, and a rectangular loop.

15. A dry process apparatus as set forth in claim 7, further comprising an auxiliary magnetic member positioned adjacent said permanent magnet to modify the magnetic field.

16. A dry process apparatus as set forth in claim 15, wherein said auxiliary magnetic member is in the form of a loop extending along said permanent magnet.

17. A dry process apparatus as set forth in claim 16, wherein the auxiliary magnetic member is an auxiliary magnet having an N-pole adjacent the S-pole of said permanent magnet and having an S-pole adjacent the N-pole of said permanent magnet.

18. A dry process apparatus as set forth in claim 17, wherein said auxiliary magnetic member is disposed radially inward of said permanent magnet.

19. A dry process apparatus as set forth in claim 15, wherein said auxiliary magnetic member is formed of a ferromagnetic material coercive.

20. A dry process apparatus as in claim 6, wherein said permanent magnet is rotatably disposed outside of said reactor for rotation in said plane.

21. A dry process apparatus as in claim 6, wherein said permanent magnet is mounted on said first electrode.

22. A dry process apparatus as in claim 1, further comprising an rf power supply, wherein the other of said first and second electrodes is electrically connected to said rf power supply.

23. A dry process apparatus as in claim 1, wherein said loop of permanently magnetized material comprises a closed loop of permanently magnetized material.

24. A dry process apparatus as set forth in claim 1, wherein said permanent magnet is formed electrically connected to the said electric power supply.

25. A dry process apparatus as set forth in claim 1, wherein said permanent magnet is electrically grounded.

26. A dry process apparatus as in claim 1, wherein said permanent magnet is formed by applying to the magnetic material thereof, an external magnetic field having magnetic field lines in the plane of said loop directed from the desired S-pole to the desired N-pole.

27. A dry process apparatus as in claim 1, wherein said permanent magnetic has a radially outer surface and a radially inner surface inside said outer surface, and has said N-pole on a first outer surface portion of said radially outer surface and has said S-pole on a second radially outer surface portion of said outer surface, opposite said first outer surface portion, said permanent magnet being magnetized north on a first portion of said inner surface opposite said S-pole and being magnetized south on a second portion of said inner surface opposite said N-pole.

* * * * *